United States Patent
Huang et al.

(10) Patent No.: US 10,706,905 B1
(45) Date of Patent: Jul. 7, 2020

(54) SINGLE PATH MEMORY SENSE AMPLIFIER CIRCUIT

(71) Applicant: GLOBALFOUNDRIES INC., Grand Cayman (KY)

(72) Inventors: Yentsai Huang, San Jose, CA (US); Chunsung Chiang, San Jose, CA (US); Wuyang Hao, San Jose, CA (US); Jack T. Wong, Fremont, CA (US); Lejan Pu, San Jose, CA (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 0 days.

(21) Appl. No.: 16/234,954

(22) Filed: Dec. 28, 2018

(51) Int. Cl.
*G11C 11/00* (2006.01)
*G11C 11/16* (2006.01)

(52) U.S. Cl.
CPC ...... *G11C 11/1673* (2013.01); *G11C 11/1693* (2013.01)

(58) Field of Classification Search
CPC .................................................. G11C 15/02
USPC .......................................................... 365/158
See application file for complete search history.

(56) References Cited

U.S. PATENT DOCUMENTS

| 7,038,959 | B2 | 5/2006 | Gami |
| 8,587,994 | B2 | 11/2013 | Kim et al. |
| 9,384,792 | B2 | 7/2016 | Bonaccio et al. |
| 9,576,653 | B1* | 2/2017 | Chou ............. G11C 13/004 |
| 9,666,259 | B1* | 5/2017 | Jung ............. G11C 11/1673 |
| 9,697,880 | B2 | 7/2017 | Andre et al. |
| 10,468,082 | B1* | 11/2019 | Huang ............ G11C 11/1673 |
| 2014/0063923 | A1* | 3/2014 | Jefremow ........ G11C 11/1673 365/158 |

FOREIGN PATENT DOCUMENTS

KR 101196167 11/2012

OTHER PUBLICATIONS

Kang et al.,"A Sense Amplifier Scheme with Offset Cancellation for Giga-bit DRAM", Journal of Semiconductor Technology and Science, vol. 7, No. 2, Jun. 2007, 9 pages.

Dong-Gi Lee et al, "STT-MRAM Read-circuit with Improved Offset Cancellation", Journal of Semiconductor Technology and Science, vol. 17, No. 3, Jun. 2017, 7 pages.

Notice of Allowance dated May 5, 2020 in related U.S. Appl. No. 16/526,196, 19 pages.

* cited by examiner

*Primary Examiner* — Hoai V Ho
(74) *Attorney, Agent, or Firm* — David Cain; Andrew M. Calderon; Roberts Calderon Safran & Cole, P.C.

(57) ABSTRACT

The present disclosure generally relates to semiconductor structures and, more particularly, to a single path memory sense amplifier circuit and methods of manufacture. The circuit includes a sense amplifier circuit comprising a plurality of self-aligned transistors in a single sensing path; and a memory array connected to the sense amplifier circuit by the single sensing path.

20 Claims, 5 Drawing Sheets

SINGLE PATH MEMORY SENSE AMPLIFIER CIRCUIT

FIELD OF THE INVENTION

The present disclosure generally relates to semiconductor structures and, more particularly, to a single path memory sense amplifier circuit and methods of manufacture.

BACKGROUND

Memory chips comprise an array of memory cells which are interconnected by bit lines and word lines. The word lines and bit lines are used to read and write binary values to each of the memory cells, with each of the memory cells representing a bit of information. Since each memory cell represents a bit of information and may be connected to other circuitry, it is desirable that the electrical and operational characteristics of all memory cells be consistent.

A sense amplifier is an element in the memory chip circuitry. Specifically, the sense amplifier senses low power signals from a bitline that represents a data bit (1 or 0) stored in a memory cell, and amplifies a small voltage swing to recognizable logic levels so that the data can be interpreted properly by logic outside of the memory. Issues can arise in a multiple path sense amplifier because they require either calibration or sizable devices to mitigate inherent device mismatch. Specifically, a mismatch between the p-type and n-type devices creates an offset between Vbit and Vref, which causes issues because the data bit resistance is equal to a reference resistance, with the reference resistance point being shifted due to the offset between Vbit and Vref.

In order to minimize the offset, larger size devices are implemented to minimize the mismatch. However, these larger devices can slow down the Vref settling time and prolong the Vbit sensing time significantly. Further, as devices continue to decrease in size, the space needed for these larger devices is not available.

SUMMARY

In an aspect of the disclosure, a circuit comprises: a sense amplifier circuit comprising a plurality of self-aligned transistors in a single sensing path; and a memory array connected to the sense amplifier circuit by the single sensing path.

In an aspect of the disclosure, a circuit comprises: a sense amplifier circuit configured to operate in an idle phase, a local bias setting phase and a sense phase and comprising a p-type transistor and an n-type transistor arranged in a single sensing path; and a plurality of resistive devices accessed by the single sensing path to read data bits stored therein.

In an aspect of the disclosure, a method comprises: operating a sense amplifier circuit in an idle phase, a local bias setting phase and a sense phase; and accessing a memory array connected to the sense amplifier circuit by a single sensing path during the local bias setting phase and the sense phase.

BRIEF DESCRIPTION OF THE DRAWINGS

The present disclosure is described in the detailed description which follows, in reference to the noted plurality of drawings by way of non-limiting examples of exemplary embodiments of the present disclosure.

DETAILED DESCRIPTION

The present disclosure generally relates to semiconductor structures and, more particularly, to a single path memory sense amplifier circuit and methods of manufacture. In embodiments, the sense amplifier is a magnetoresistive random-access memory (MRAM) sense amplifier. The structures and processes described herein allow for a single sensing path sense amplifier to sense (read) data bits from resistive devices in an MRAM using a single sensing path. Advantageously, by providing a single sensing path sense amplifier, the mismatch and consequential calibrations of sense amplifiers having multiple sensing paths are avoided, thereby improving device performance.

The proposed circuitry of the present disclosure allows for the reading of multiple data bits from resistive devices using a single sensing path, as opposed to conventional sense amplifiers which use multiple paths to read one data bit and either one or multiple reference bits in one read cycle. The structures and processes described herein achieve this single path by operating in three phases: idle, local bias setting and sense. In the idle phase, a global bias initiates the local bias. Further, a local reference bias Vref is equal to a global reference bias Vrefg, a capacitor C0 is precharged to Vrefg and a first p-type device (P1) is OFF. In the local bias setting phase, the global bias is closed to the local preamp region. In this way, the P1 device is diode connected to set the local reference bias Vref to R0, where R0=Rref. In the sense phase, the global bias is closed to the local preamp region and data is sensed from bit 1 to bit N, with a second stage amplifier comparing a preamp data sense output Vbit with Vref. In embodiments, if Vrefg is closed to Vref, the local bias settling time will be shorter in the local bias setting phase. However, it is not necessary for Vrefg in the idle phase and Vref in the local bias setting phase to be the same, because a relatively faster settling time will be adjusted by the transistors of the self-aligned single sensing path sense amplifier.

The structures and processes described herein provide a global initialization, a local reference bias setting and the sensing of multiple data. The single path provided by the structures and processes described herein takes advantage of relatively small sized devices which can obtain higher speeds and reduced power consumption compared to larger devices used in conventional sense amplifiers. For example, by sharing four data accesses with the single path sense amplifier of the present disclosure, about ⅜ of the power of four non-sharing single path sense amplifiers is saved. Further, the circuitry described herein provides a sample-and-hold circuit which samples Vref and holds Vref. With this sample-and-hold approach, the self-aligned single path sense amplifier can access multiple data bits (I/O) in one read cycle. This multiple data access with the same bias reduces power consumption up to (N+1)/2N, where N is the number of data accesses.

In embodiments, the structure comprises, for example: a sense amplifier having a global initialization for a local bias setting; and a single sensing path scheme which is self-aligned and immune from the offset caused by a mismatch of p-type and n-type devices, wherein the devices implemented benefit from no mismatch and have much less parasitic speeds to up the sense amplifier sensing time. The single sensing path sense amplifier employs a sample-and-hold approach to access multiple data bits (I/O) in one read cycle. The multiple data accesses use the same bias to reduce power up consumption to (N+1)/2N, where N is a number of data accesses.

In embodiments, the method comprises, for example: forming global initialization speeds to up a local bias setting of a sense amplifier; and implementing a single sensing path scheme which is self-aligned and immune from the offset provided from device mismatch. The single sensing path senses multiple data bits and eliminates the mismatch from multiple references, thereby saving power. The lack of mismatch also allows for an adoption of relatively small devices.

The structures of the present disclosure can be manufactured in a number of ways using a number of different tools. In general, though, the methodologies and tools are used to form structures with dimensions in the micrometer and nanometer scale. The methodologies, i.e., technologies, employed to manufacture the structure of the present disclosure have been adopted from integrated circuit (IC) technology. For example, the structures are built on wafers and are realized in films of material patterned by photolithographic processes on the top of a wafer. In particular, the fabrication of the structure uses three basic building blocks: (i) deposition of thin films of material on a substrate, (ii) applying a patterned mask on top of the films by photolithographic imaging, and (iii) etching the films selectively to the mask.

Figure 1A:
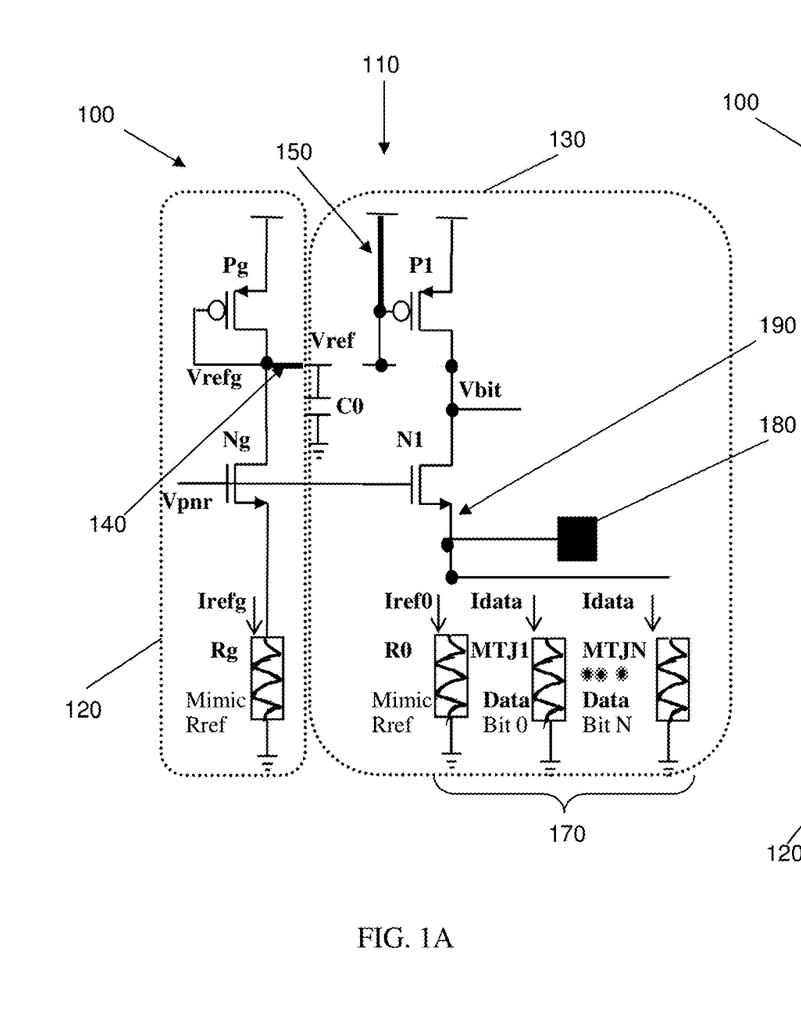
FIGS. 1A-1C show schematic illustrations of a self-aligned single path for a magnetoresistive random-access memory (MRAM) sense amplifier circuit having different phases and respective fabrication processes in accordance with aspects of the present disclosure.
Figure 1B:
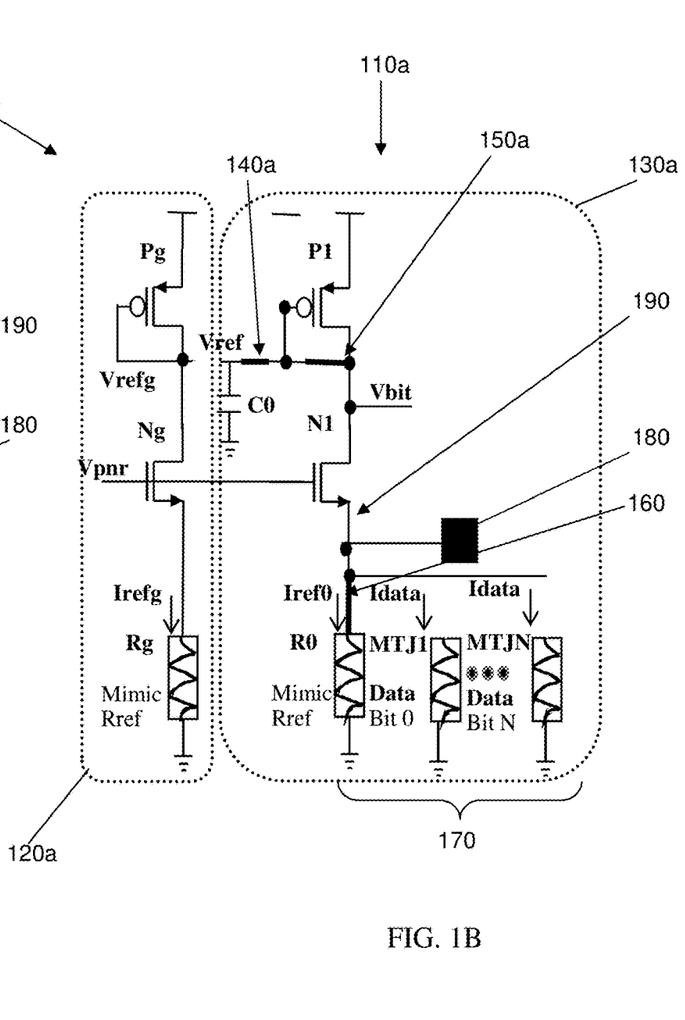
Figure 1C:
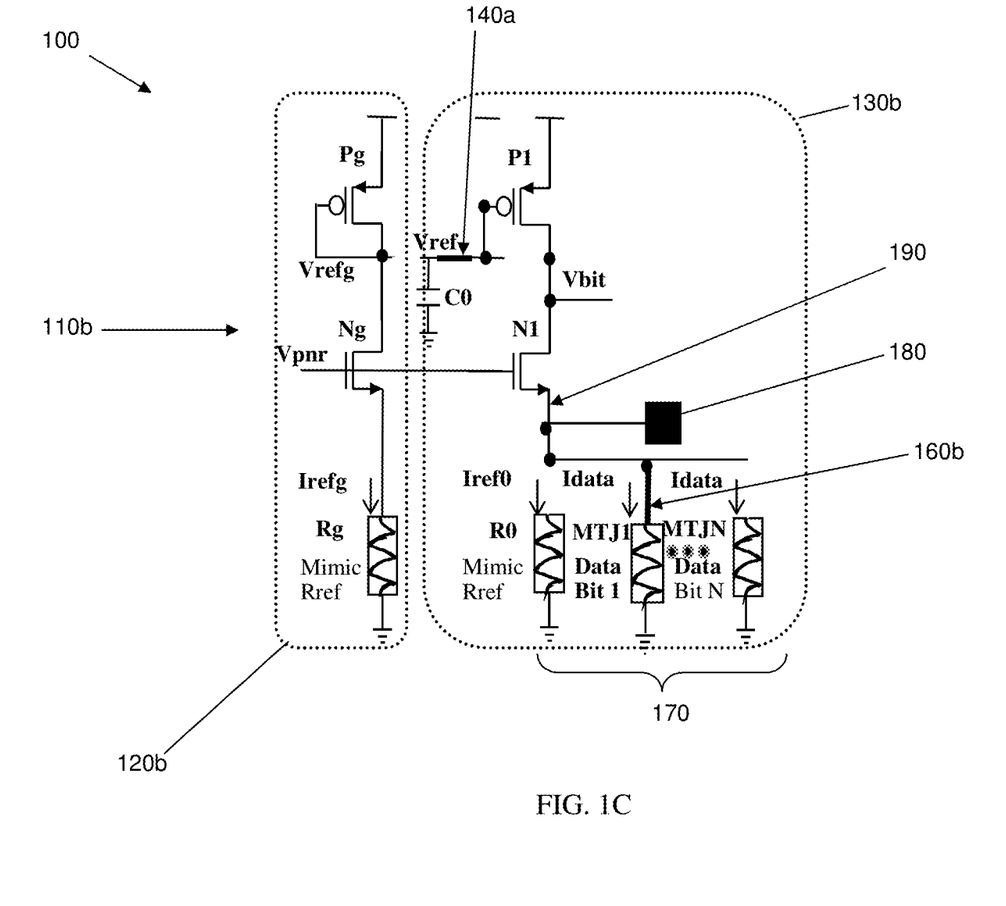

FIGS. 1A-1C show illustrative schematics of a single sensing path sense amplifier circuit 100 for use in accordance with aspects of the present disclosure. The circuit 100 is part of a read circuitry that is used for reading data from a memory, e.g., a magnetoresistive random-access memory (MRAM). In embodiments, the circuit 100 is configured to operate in three phases: an idle phase 110, a local bias setting phase 110a and a sense phase 110b.

The circuit 100 of the present disclosure allows for the reading of multiple data bits from resistive devices using a single path, as opposed to conventional sense amplifiers which use multiple paths to read one data bit with either one or multiple bits of reference across resistive devices. The operation of three different phases 110, 110a, 110b allows the circuit 100 to provide for the single sensing path, which is immune from the offset that can occur during a mismatch of devices, e.g., n-type and p-type devices. In this way, the structures and processes described herein allow for relatively ultra-small sense amplifier devices that benefit from no mismatch, and which can be implemented in a semiconductor memory chip. Further, these ultra-small sense amplifier devices have much less parasitic capacitance, which speeds up the sense amplifier sensing time.

The circuit 100 is a sample-and-hold circuit which allows for the sensing of multiple data bits using a single sensing path. Specifically, the circuit 100 samples a local reference bias Vref, and holds Vref, thereby allowing access to multiple data bits (I/O) in one read cycle without the need for multiple paths. This multiple data access uses the same bias to sense (read) the different data bits, thereby reducing a power consumption of up to (N+1)/2N, where N is the number of data accesses.

In embodiments, the circuit 100 comprises global bias regions 120, 120a, 120b and local preamp regions 130, 130a, 130b. The global bias regions 120, 120a, 120b comprise a global p-type metal-oxide-semiconductor (PMOS) device Pg, which generates a global reference bias Vrefg. An n-type metal-oxide-semiconductor (NMOS) device Ng, which has a global bias Vpnr applied to its gate, generates a global reference current Irefg for application to the global resistive device Rg. In embodiments, the resistive device Rg mimics the resistance of resistance reference Rref.

The local preamp regions 130, 130a, 130b comprise a capacitor C0, which stores the voltage sampled for a read operation. C0 can be connected between Vref and power supply, instead of ground, for better tracking to power supply. Additionally, the local preamp regions 130, 130a, 130b comprise a p-type device P1 and an n-type device N1, which are self-aligned since P1 and N1 are the same devices at the same biases using in both the local bias setting phase and the sense phase. In this way, the plurality of self-aligned transistors P1, N1 comprise a p-type device and a n-type device, with the p-type transistor P1 and the n-type transistor N1 being self-aligned with respect to one another.

The drain of the P1 device is connected to the source of the N1 device, along with the preamp data sense output Vbit being applied to the source of N1 device. The global bias Vpnr from the Ng device is maintained and applied to the gate of the N1 device. The local preamp regions 130, 130a, 130b further comprise a resistive device R0 and an array 170 comprising a plurality of resistive devices MTJ1 though MTJN, which have data bits stored therein. In this way, the structures and processes described herein provide for a sense amplifier circuit 100 comprising self-aligned transistors N1, P1 in a single sensing path 190, and a memory array 170 connected to the sense amplifier circuit 100 by the single sensing path 190. More specifically, a plurality of resistive devices R0, MTJ1, MTJN are accessed by the single sensing path 190 to read data bits stored therein.

The resistive device Rg of the global bias regions 120, 120a, 120b, and the resistive devices R0, MTJ1, MTJN of the local preamp regions 130, 130a, 130b can be magnetic tunnel junction (MTJ) memory cells for a magnetoresistive random-access memory (MRAM) storage device. By applying a bias to the resistive devices Rg, R0, MTJ1, MTJN, the data bits stored within the resistive devices MTJ1, MTJN can be read. For example, the bias provided by Iref0 in the local preamp region 130a allows for the reading of the resistive device R0. Specifically, the circuit 100 uses R0 to generate the local reference bias Vref voltage and then compares the resistive device MTJ1, . . . , MTJN one by one, with the preamp data sense outputting the Vbit voltage.

The differential voltage between Vbit and Vref is used to read the data bits stored within the resistive devices MTJ1, . . . , MTJN. In this way, the structures and processes described herein provide for determining a differential charge between Vref and Vbit. In embodiments, the resistive devices Rg, R0, MTJ1, MTJN can be HIGH or LOW resistive devices, depending on the application. In this way, the different resistive devices Rg, R0, MTJ1, MTJN will have different resistance values. In a mid-point MRAM sense scheme, the R0 resistance is between Rap (more resistive anti-parallel state) and Rp (less resistive parallel state)

During the idle phase 110 of the circuit 100, the voltage Vref of the local preamp region 130 is in electrical connection 140 with the gate of the Pg device. Accordingly, Vref is set equal to the global reference bias Vrefg. Since Vref=Vrefg, the capacitor C0 is precharged with Vrefg. The P1 device of the local preamp region 130 is OFF since P1 it is not in electrical connection with Vref. Specifically, the gate and drain of P1 is disconnected from the global bias region 120. In this way, P1 is OFF because of the electrical connection 150 between a gate of the P1 device and a power supply. More specifically, the p-type device (P1) is biased by a diode-connected p-type device in the idle phase 110. Additionally, N1 has no electrical connection to R0 and any MTJ. Accordingly, no static power dissipates in the local preamp region 130.

The resistive devices R0 and MTJ1, MTJN of the memory array 170 are accessed by a multiplexer connected to a timer, represented by the multiplexer/timer 180. In this way, the circuit 100 comprises a timer and a multiplexer in connection with the single sensing path 190. More specifically, the multiplexer/timer 180 determine which, if any, of the resistive devices R0, MTJ1, MTJN is read in view of the current biases Iref0, Idata. In this way, the timer is preprogrammed to select one of the MTJ memory cells. For example, in the idle phase 110, the multiplexer/timer 180 shut OFF the memory array 170. Specifically, the local preamp region 130 and a following stage comparator of the sense amplifier circuit 100 are shut off during idle phase 110. Accordingly, the resistive devices R0, MTJ1, MTJN of the memory array 170 are not accessed in the local preamp region 130 during the idle phase 110.

FIGS. 1B and 1C show the local bias setting phase 110a and the sense phase 110b, respectively. In these subsequent phases 110a, 110b, Vrefg is opened to Vref because of the lack of electrical connection between Vrefg and Vref. Vref will settle to local bias by accessing R0. This less differential charge between Vrefg and Vref allows for a local bias settling time to be relatively shorter, i.e., faster, in the local bias setting phase 110a. In this way, the p-type device P1 is biased by a local reference bias Vref in the local bias setting phase 110a and the sense phase 110b. Further, the capacitor Co stores the Vrefg during the local bias setting phase 110a and the sense phase 100b. In embodiments, the settling time of the local bias setting phase 110a is not exactly the same between 130a of all sense amplifiers; however, it is not necessary for the settling time to be exactly the same in the local bias setting phase 110a of amplifiers, because any relatively faster settling time will be adjusted by the small length devices P1 and N1 (e.g., devices).

Continuing with FIG. 1B, during the local bias setting phase 110a, there is no electrical connection between Vrefg and Vref. Accordingly, Vref is obtained from the capacitor C0, which was charged with Vrefg during the idle phase 110. In this way, Vref=Vrefg. Electrical connection 140a allows for Vref to bias the P1 device, while electrical connection 150a allows for the N1 device to be biased with Vref. Accordingly, the structures and processes described herein comprise a capacitor C0 which biases the p-type device P1 and the n-type device N1 during the local bias setting phase 110a. More specifically, the local bias setting phase 110a comprises biasing a p-type device P1 with a stored local reference bias Vref and applying a preamp data sense output Vbit to an n-type device Ni.

In embodiments, P1 is connected to set the local bias Vref to R0, where R0=Rref. Accordingly, the differential charge between Vref and Vbit is Low because there is no less of a differential between Vref and Vbit due to the electrical connections 140a, 150a. In this way, resistive device R0 is accessed for reading (sensing) by the bridge connection 160 and the reference current Iref0 is ON. In this way, the new local Vref is set by accessing R0. The differential between Vref and Vbit is ignored in the local bias setting phase 110a, but will be used for the subsequent data sense phase 110b.

In the local bias setting phase 110a, the local bias setting phase is set to the local Vref because of the device mismatch of the p-type devices between P1 and Pg and the n-type devices between N1 and Ng. This is because P1 is not in electrical connection with Pg and connect to N1 and R0. Accordingly, the mismatch and offset of the p-type devices between P1 and Pg and the n-type devices between N1 and Ng changes the charge of Vref from Vrefg during the local bias setting phase 110a.

FIG. 1C shows the circuit 100 in the sense phase 110b. Similar to the local bias setting phase 110a, there is no electrical connection between Vrefg and Vref in the sense phase 110b. Instead, Vref is obtained from the capacitor C0, which was charged with Vrefg during the idle phase 110, and then was charged with a local bias during the local bias phase 110a. In embodiments, electrical connection 140a allows for Vref to bias the P1 device, with the drain of the P1 device connected to the source of the N1 device. More specifically, the structures and processes described herein comprise a capacitor C0 which biases the p-type device P1 during the sense phase 110b. The differential resistance between MTJ and R0 generates a differential charge between Vbit and Vref while P1 is being biased by Vref, which generates the read current Idata. In embodiments, a second stage amplifier can compare Vbit with Vref differential charge to determine the data stores in MTJ.

Accordingly, resistive device MTJ1 of the memory array 170 is accessed for reading (sensing) by bridge connection 160b since the memory array 170 is turned ON by a multiplexer/timer 180. More specifically, the reference current Idata is ON, which will bias the multiplexer/timer 180 to activate resistive device MTJ1. In this way, data is sensed (read) from bit 1 of MTJ1 to bit N of MTJN using a single path from the current bias Idata. Specifically, the timer and multiplexer combination (multiplexer/timer 180) is preprogrammed to access a certain resistive device as opposed to accessing another. For example, the multiplexer/timer 180 is preprogrammed to access resistive device MTJ1 as opposed to resistive device R0.

In view of the structures and processes described herein, there is little to no device mismatch of the path with devices P1 and N1 during the sense phase 110b and local bias setting phase 110a because devices P1 and N1 share the same path. By operating in the idle phase 110, the local bias setting phase 110a and the sense phase 110b, along with implementing a sample-and-hold approach with respect to Vref, the circuit 100 achieves reading of data bits stored with an MRAM by using the single sensing path.

The ability to read multiple data bits by using a single sensing path allows for the mismatch and consequential calibrations of conventional sense amplifiers with multiple sensing paths to be avoided, thereby improving device performance. Accordingly, the single sensing path takes advantage of relatively small sized devices which can obtain higher speeds and reduced power compared to larger devices used in conventional sense amplifiers. Further, power is reduced by sharing the single path sense amplifier to sense more data. For example, by sharing four data accesses with the single path sense amplifier of the present disclosure, about 5/8 of the power of four single-path sense amplifiers without sharing are used. The multiple data accesses with the same bias reduces power consumption up to (N+1)/2N, where N is the number of data accesses.

Figure 2:
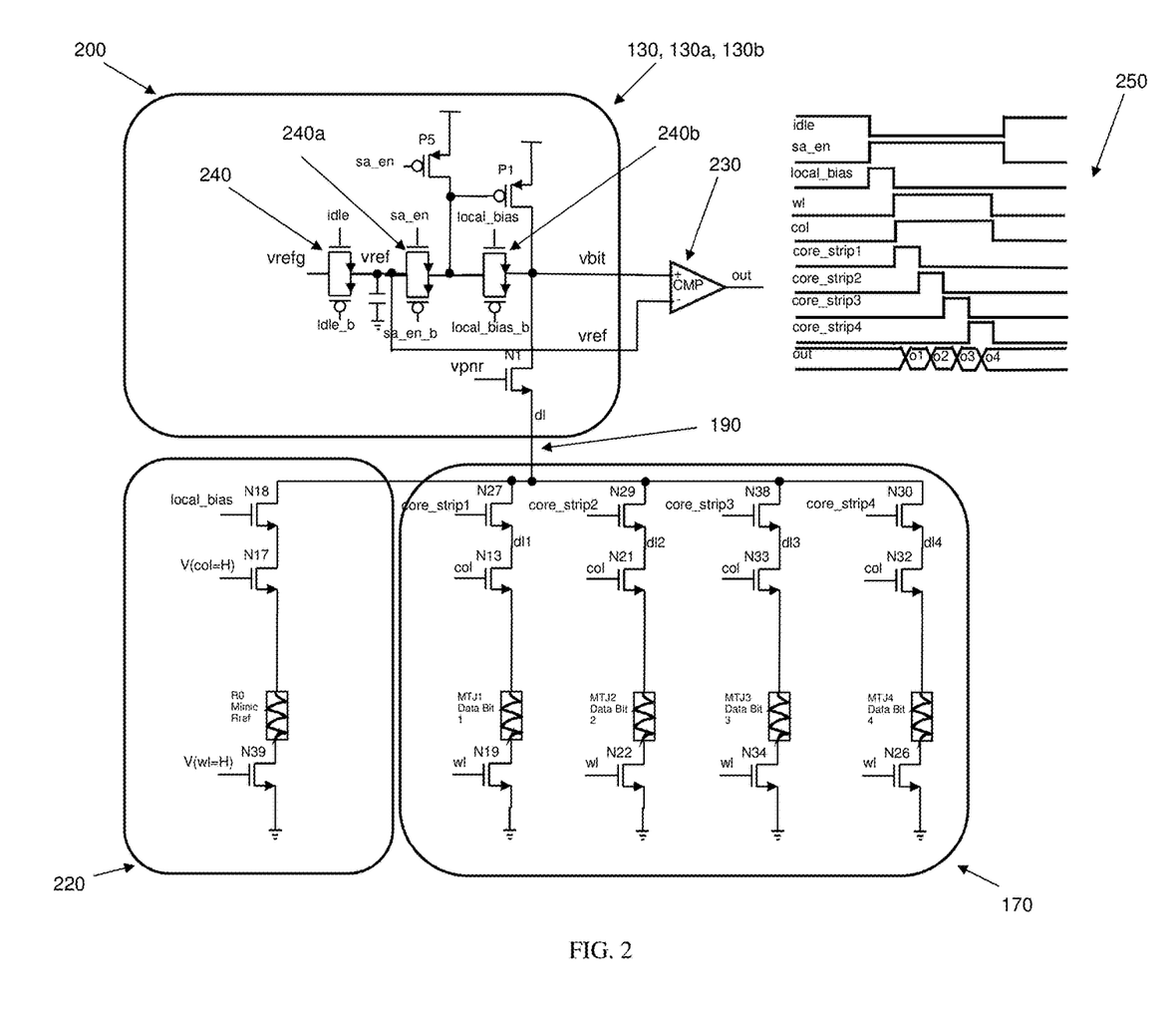
FIG. 2 shows a schematic of a 4-data bit sensing circuit, amongst other features, and respective fabrication processes in accordance with aspects of the present disclosure.

FIG. 2 shows an exemplary circuit 200 for a reading of four data bits using the single sensing path sense amplifier of circuit 100. In embodiments, the circuit 200 includes the local preamp regions 130, 130a, 130b, which comprise the devices P1, P5, N1 and switches 240, 240a, 240b. The activation of the first switch 240 will set the local reference bias Vref equal to the global reference bias Vrefg of the global bias regions 120, 120a, 120b. Upon the activation of the second switch 240a, Vref will bias the P1 device, similar to the biasing of P1 in the local bias setting phase 110a and the sense phase 110b. In alternative embodiments, the third switch 240b is activated in local bias phase so that P1 is biased by the preamp data sense output Vbit. During the local bias phase, the stage comparator 230 are shut off.

Continuing with FIG. 2, the devices P1 and N1 form a single sensing path 190, self-aligned between local bias and sensing phases, to the memory array 170. The memory array 170 comprises resistive devices R0, MTJ1, MTJ2 ... MTJN and NMOS devices N13, N19, N21, N22, N26, N27, N29, N30, N32, N33, N34, N38. In embodiments, the timer and multiplexer, e.g., multiplexer/timer 180, are turned ON and then a read current created by the differential charge between Vref and Vbit. In this way, the timer and multiplexer combination allows for the NMOS devices N13, N19, N21, N22, N26, N27, N29, N30, N32, N34, N38 to be biased by the read current, depending on the programming of the timer of the multiplexer/timer 180. In embodiments, a local reference region 220 can provide a local bias to the memory array 170 if needed. More specifically, a differential charge between the local reference bias Vref, which is generated by the local reference region 220, and the preamp data sense output Vbit, is used to read the data bits stored within the resistive devices, MTJ1, MTJN. In embodiments, the local reference region 220 comprises NMOS devices N18, N17, N39 and resistive device R0. The timer timings 250 of the multiplexer/timer 180 illustrates the idle, local bias setting and four date sensing sequences used to achieve the phases 110, 110a, 110b. For example, timing sequence sa en activates the switch 240a, which allows Vref to be applied to the gate of the P1 device. This allows for the activation of one of the phases 110, 110a, 110b, depending on the value of Vref, e.g., during the idle phase 110 Vref is set to global Vrefg.

Figure 3:
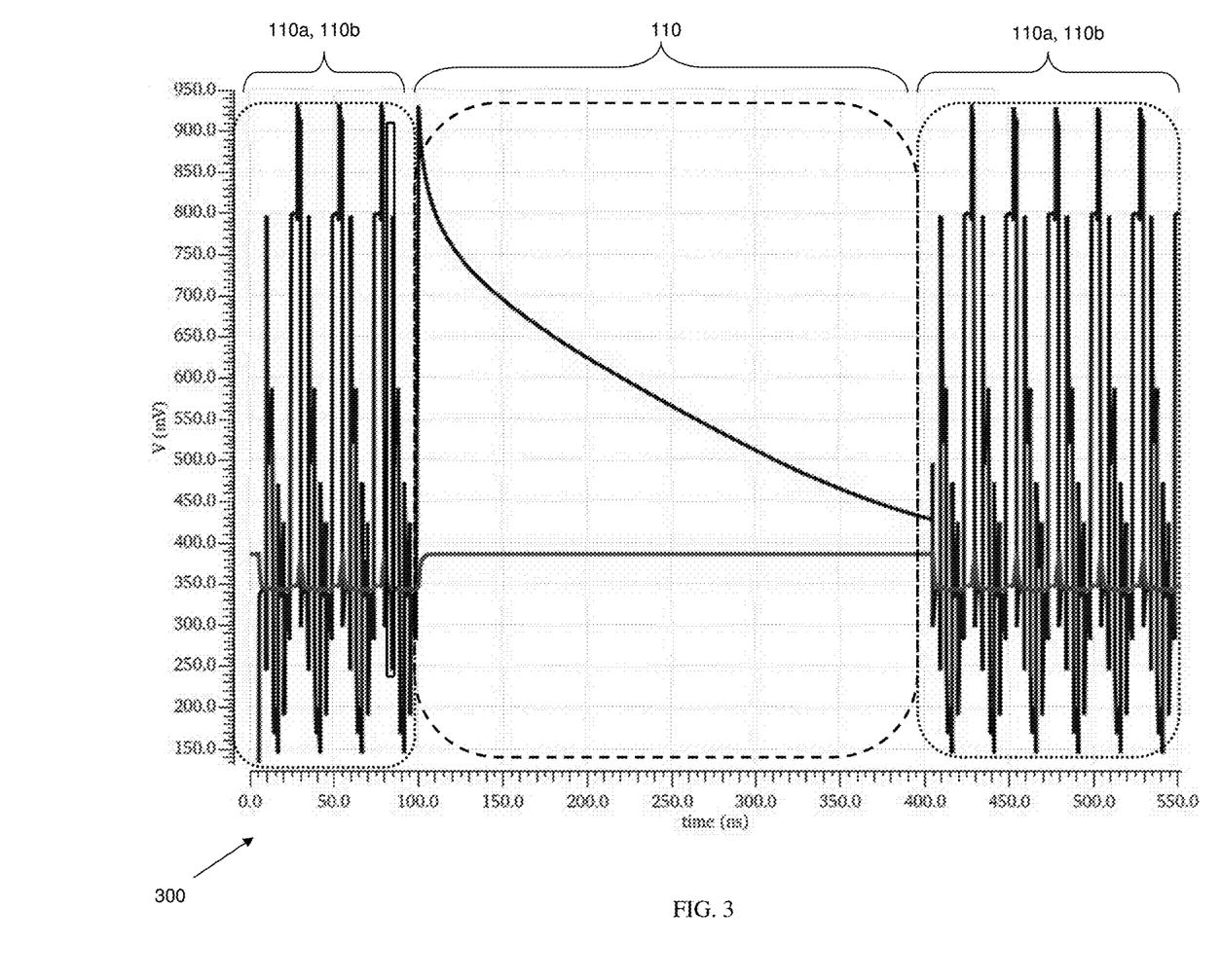
FIG. 3 shows Vref and Vbit values for a 4-bit read cycle, amongst other features, in accordance with aspects of the present disclosure.

FIG. 3 shows a simulation 300 of Vref compared to Vbit in millivolts (mV) over time (nanoseconds) during the phases 110, 110a, 110b. The time periods for the phases 110a, 110b are in a range of about 5 ns to 100 ns and after 400 ns, with the idle phase 110 occupying the time between those time periods. In embodiments, the four data bits which are read are set to Rdata={Rref+1000Ω, Rre−1000Ω, Rref+100Ω, Rref−100Ω} and R0=Rref, which is repeated during each data read cycle.

Figure 4:
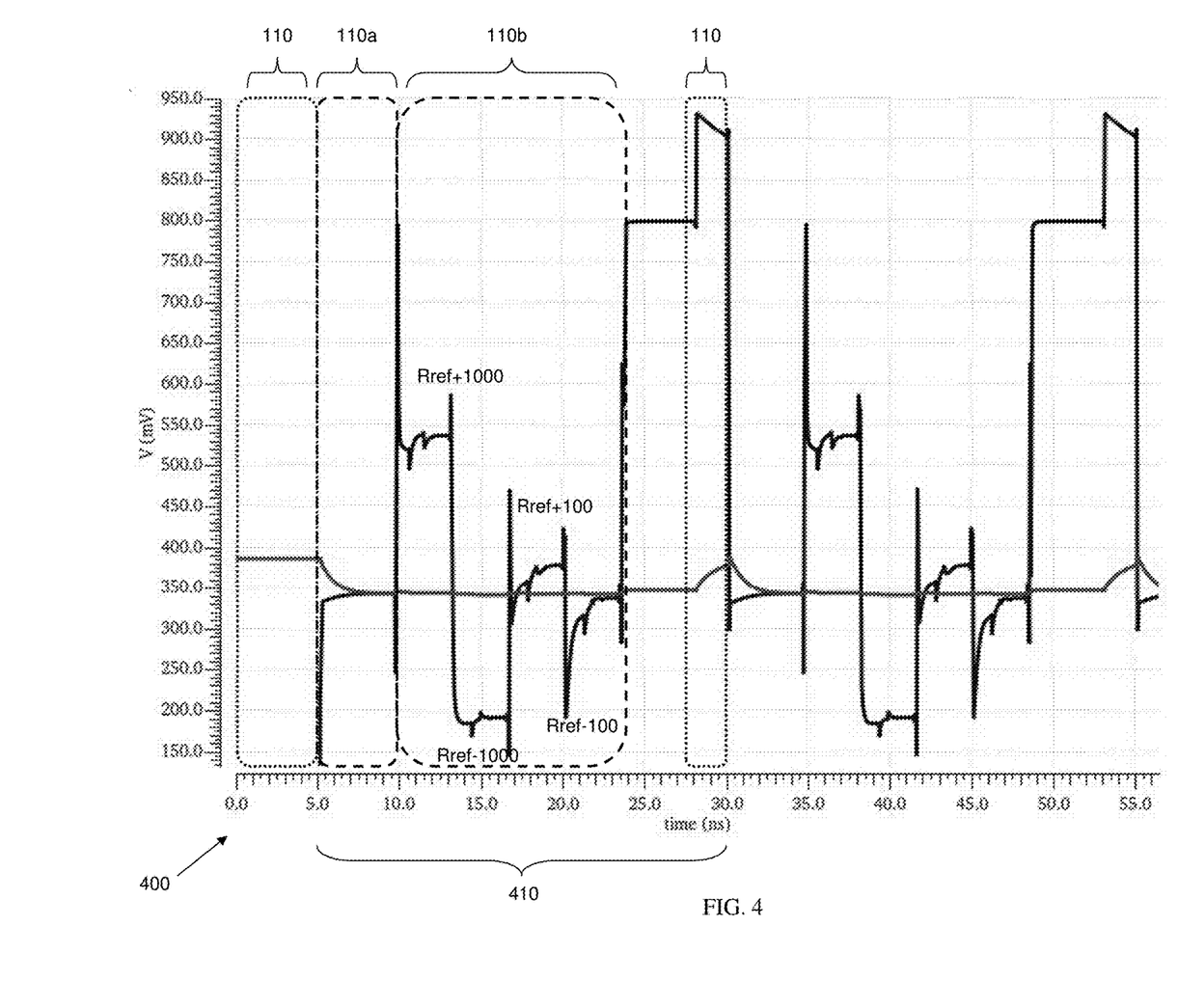
FIG. 4 shows Vref and Vbit values for two 4-bit read cycles, amongst other features, in accordance with aspects of the present disclosure.

FIG. 4 shows a simulation 400 of Vref compared to Vbit in millivolts (mV) over time (nanoseconds) during the phases 110, 110a, 110b for two 4-bit read cycles, where the three phases make up one read cycle 410. The time period between about 0 ns to 5 ns shows the idle phase 110 where Vref is set to global Vrefg, the time period between about 5 ns to 10 ns and about 30 ns to 35 ns shows the local bias setting phase 110a having a local Vref setting, and the time periods between about 10 ns to 23 ns and about 35 ns to 48 ns are the sense phase 110b. In embodiments, the four data bits which are read are set to Rdata=Rref+1000Ω, Rref−1000Ω, Rref+100Ω, Rref−100Ω} in a repeat sequence. The Vbit level is either greater or lesser than Vref, as reflected by the resistance difference with respect to the local reference R0=Rref.

It should now be understood that the processes and resultant structures described herein will serve to further device performance for memory circuits by providing a sense amplifier which utilizes a single sensing path to read data bits. Advantageously, by providing a single sensing path sense amplifier, the mismatch and consequential calibrations of sense amplifiers having multiple sensing paths are avoided, thereby improving device performance.

The structures and processes described herein provide a global initialization, a local reference bias setting and the sensing of multiple data. The single path provided by the structures and processes described herein take advantage of relatively small sized devices which can obtain higher speeds and reduced power compared to larger devices used in conventional sense amplifiers. Specifically, the proposed circuitry provides a sample-and-hold circuit which samples Vref and holds Vref. With this sample-and-hold approach, the proposed self-aligned single path sense amplifier can access multiple data bits (I/O) in one read cycle. This multiple data access with the same bias reduces power consumption up to (N+1)/2N, where N is the number of data accesses.

The method(s) as described above is used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The descriptions of the various embodiments of the present disclosure have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed:
1. A circuit, comprising:
 a sense amplifier circuit comprising a plurality of self-aligned transistors in a single sensing path;
 a memory array connected to the sense amplifier circuit by the single sensing path; and
 a timer connected to the single sensing path at a location between the sense amplifier circuit and the memory array, and configured to select individual resistive devices in the memory array.

2. The circuit of claim 1, wherein the sense amplifier circuit is configured to operate in an idle phase, a local bias setting phase and a sense phase.

3. The circuit of claim 2, wherein the plurality of self-aligned transistors comprise a p-type device and a n-type device.

4. The circuit of claim 3, wherein the p-type device is biased by a diode-connected p-type device in the idle phase.

5. The circuit of claim 3, further comprising a capacitor which biases the p-type device and the n-type device during the local bias setting phase.

6. The circuit of claim 3, further comprising a capacitor which biases the p-type device during the sense phase.

7. The circuit of claim 1, wherein the memory array comprises a plurality of resistive devices forming a random access memory (RAM).

8. The circuit of claim 7, wherein the plurality of resistive devices are magnetic tunnel junction (MTJ) memory cells.

9. The circuit of claim 8, wherein the MTJ memory cells form a magnetoresistive random-access memory (MRAM).

10. The circuit of claim 9, further comprising a multiplexer connected to the timer in connection with the single sensing path.

11. The circuit of claim 10, wherein the sense amplifier circuit is configured to operate in an idle phase, a local bias setting phase and a sense phase, wherein the plurality of self-aligned transistors comprise a p-type device and a n-type device, wherein the p-type device is biased by a diode-connected p-type device in the idle phase, wherein the timer is preprogrammed to turn the memory array on and off at predetermined times, and wherein the timer and multiplexer combined are preprogrammed to select individual ones of the MTJ memory cells in accordance with times provided by the timer, and further comprising a capacitor which biases the p-type device and the n-type device during the local bias setting phase and a capacitor which biases the p-type device during the sense phase.

12. A circuit, comprising:
  a sense amplifier circuit configured to operate in an idle phase, a local bias setting phase and a sense phase and comprising a p-type transistor and an n-type transistor arranged in a single sensing path;
  a plurality of resistive devices accessed by the single sensing path to read data bits stored therein; and
  a timer and a multiplexer connected to the single sensing path at a location between the sense amplifier circuit and the plurality of resistive devices,
  wherein the timer is preprogrammed to select individual ones of the plurality of resistance devices.

13. The circuit of claim 12, wherein the p-type transistor and the n-type transistor are self-aligned with respect to one another.

14. The circuit of claim 12, wherein the p-type device is biased by a local reference bias Vref in the local bias setting phase and the sense phase.

15. The circuit of claim 14, wherein the sense amplifier circuit is a sample-and-hold circuit which samples the Vref and holds the Vref.

16. The circuit of claim 15, wherein Vref is equal to a global reference bias Vrefg during the idle phase.

17. The circuit of claim 15, further comprising a capacitor which stores the Vrefg during the local bias setting phase and the sense phase.

18. A method, comprising:
  applying voltages to bias a sense amplifier circuit to operate in an idle phase, a local bias setting phase and a sense phase;
  accessing a memory array connected to the sense amplifier circuit by a single sensing path during the local bias setting phase and the sense phase; and
  selecting individual memory elements in the memory array based on timing signals coupled to the single sensing path by a timer coupled to the single sensing path at a point between the sense amplifier circuit and the memory array.

19. The method of claim 18, wherein the local bias setting phase comprises biasing a p-type device with a stored local reference bias Vref and applying a preamp data sense output Vbit to an n-type device.

20. The method of claim 18, further comprising determining a differential charge between Vref and Vbit.

* * * * *